(12) United States Patent
Kromotis et al.

(10) Patent No.: US 7,456,500 B2
(45) Date of Patent: Nov. 25, 2008

(54) LIGHT SOURCE MODULE AND METHOD FOR PRODUCTION THEREOF

(75) Inventors: Patrick Kromotis, Regensburg (DE); Günter Waitl, Regensburg (DE)

(73) Assignee: Osram Opto Semiconductors GmbH, Regenburg (DE)

( * ) Notice: Subject to any disclaimer, the term of this patent is extended or adjusted under 35 U.S.C. 154(b) by 0 days.

(21) Appl. No.: 10/529,718

(22) PCT Filed: Sep. 24, 2003

(86) PCT No.: PCT/DE03/03189

§ 371 (c)(1), (2), (4) Date: Oct. 27, 2005

(87) PCT Pub. No.: WO2004/032571

PCT Pub. Date: Apr. 15, 2004

(65) Prior Publication Data

US 2006/0138441 A1    Jun. 29, 2006

(30) Foreign Application Priority Data

Sep. 30, 2002  (DE) .............................. 102 45 945

(51) Int. Cl.
*H01L 23/34* (2006.01)

(52) U.S. Cl. .......................... 257/725; 257/81; 257/99; 257/676; 257/E25.02; 257/E33.058; 438/112

(58) Field of Classification Search ................. 257/676, 257/E33.058, 81, 99, 725, E25.02; 438/112, 438/106

See application file for complete search history.

(56) References Cited

U.S. PATENT DOCUMENTS

| | | | |
|---|---|---|---|
| 4,845,405 A | 7/1989 | Yamane et al. | |
| 4,935,665 A | 6/1990 | Murata | |
| 5,773,878 A * | 6/1998 | Lim et al. | 257/676 |
| 6,545,332 B2 * | 4/2003 | Huang | 257/433 |
| 6,653,661 B2 * | 11/2003 | Okazaki | 257/98 |
| 2002/0139987 A1 * | 10/2002 | Collins et al. | 257/88 |
| 2003/0122247 A1 * | 7/2003 | Joshi | 257/723 |
| 2003/0178627 A1 | 9/2003 | Marchl et al. | |
| 2004/0089898 A1 | 5/2004 | Ruhnau et al. | |

FOREIGN PATENT DOCUMENTS

| | | |
|---|---|---|
| DE | 100 51 159 A1 | 5/2002 |
| DE | 102 29 067 A1 | 1/2004 |
| JP | 5-25604 | 4/1993 |
| JP | 06140673 | 5/1994 |

(Continued)

OTHER PUBLICATIONS

Computer translation of JP 2001085748 as listed on the IDS filed Mar. 30, 2005.*
Translation of Official Letter dated Aug. 22, 2007, issued in corresponding Japanese application No. 2004-540508.
Examination Report dated Aug. 24, 2007 issued for the corresponding Chinese Patent Application No. 03823394.0.
Japanese Office Action in English translation dated Apr. 1, 2008 issued for the underlying Japanese Patent Application No. 2004-540508 (4 pgs).

*Primary Examiner*—Wai-Sing Louie
*Assistant Examiner*—John C Ingham
(74) *Attorney, Agent, or Firm*—Cohen Pontani Lieberman & Pavane LLP

(57) ABSTRACT

A light source module having a plurality of LEDs connected to a metal carrier (4) by means of an insulating layer (3). In order to afford protection against mechanical effects and in order to form a reflector, the LEDs are surrounded by a frame (10), which is segmented into a plurality of parts by expansion joints (13), in order that stresses occurring as a result of temperature fluctuations are absorbed.

12 Claims, 4 Drawing Sheets

| | FOREIGN PATENT DOCUMENTS | | JP | 2001085748 | 3/2001 |
|---|---|---|---|---|---|
| | | | WO | WO 99/41785 | 8/1999 |
| JP | 63-24857 | 11/1994 | | | |
| JP | 8-123340 | 5/1996 | * cited by examiner | | |

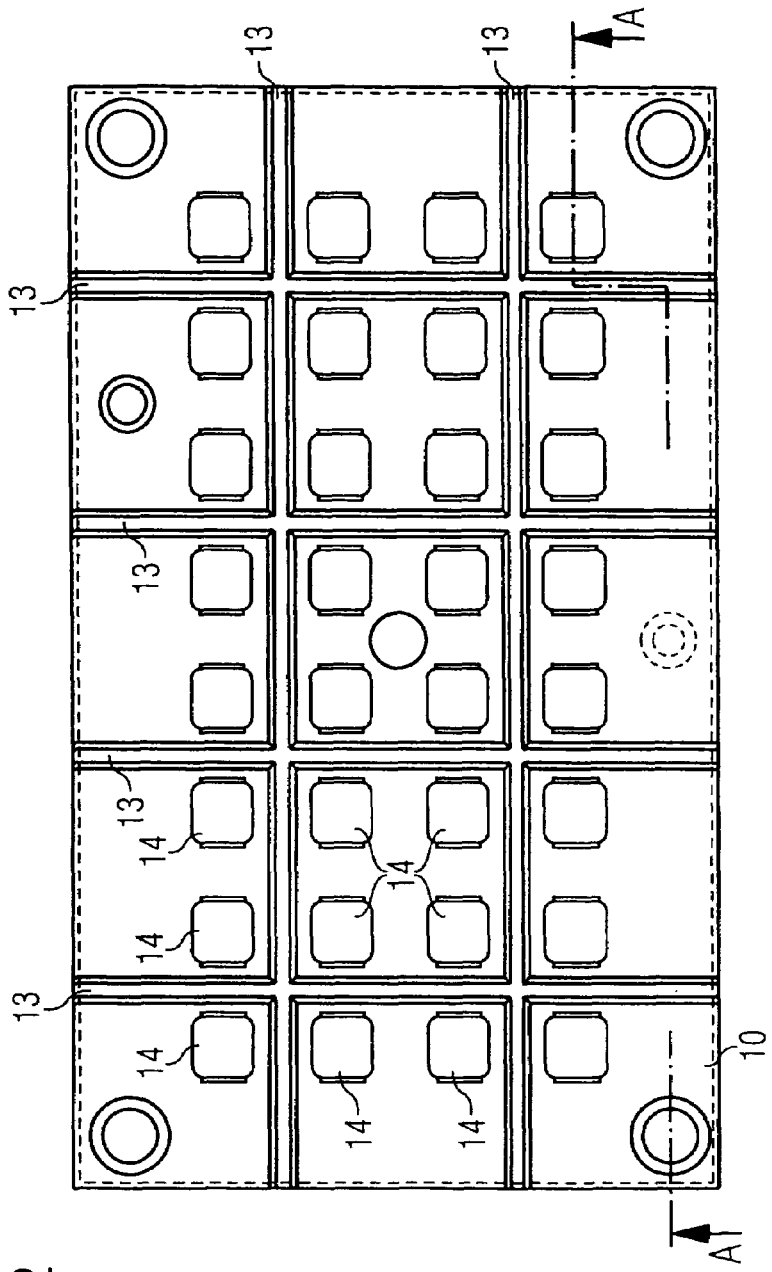
FIG 2
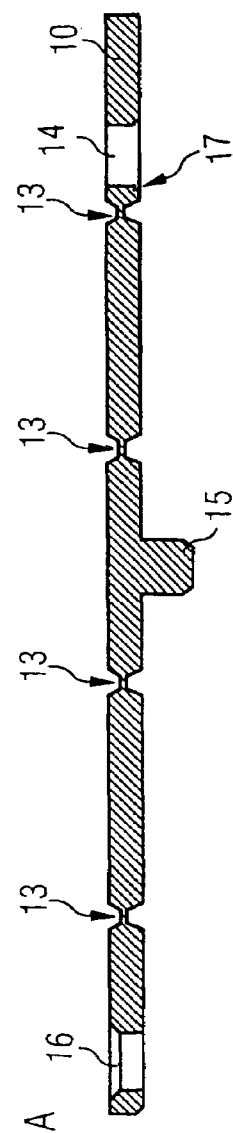
FIG 3 A-A

FIG 4A
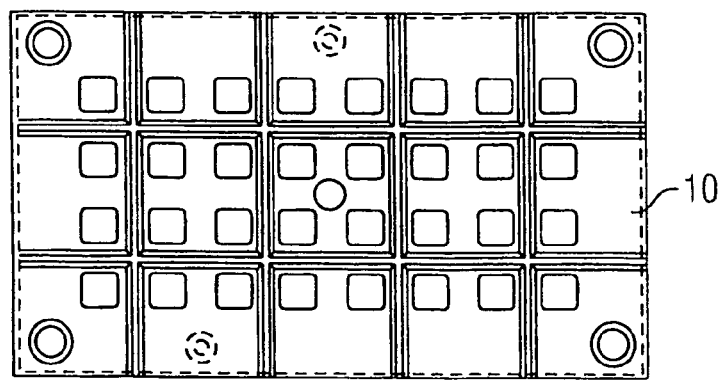
FIG 4B
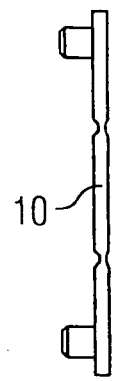
FIG 5A
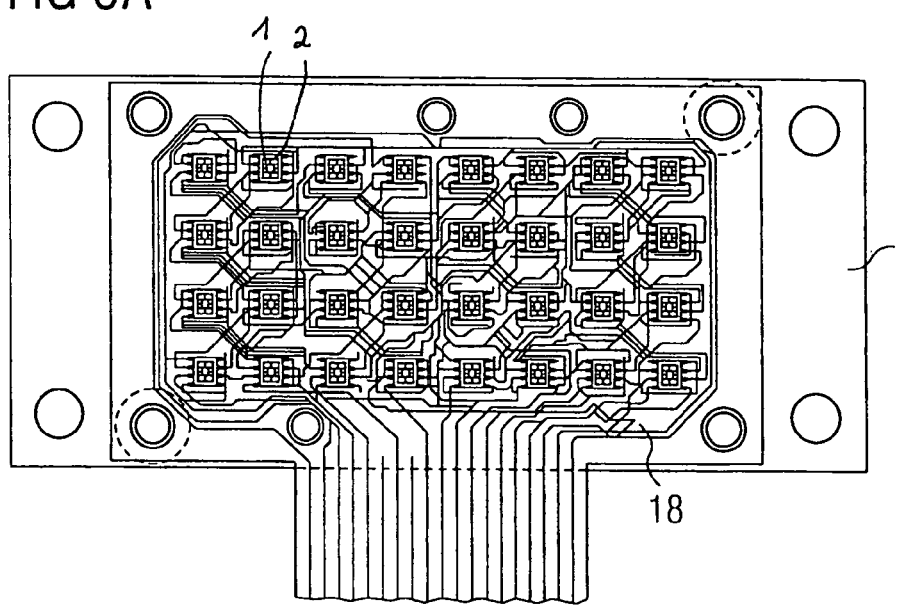
FIG 5B
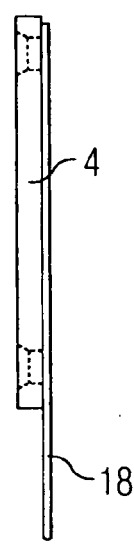
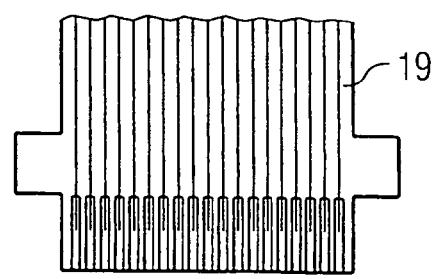

FIG 6A
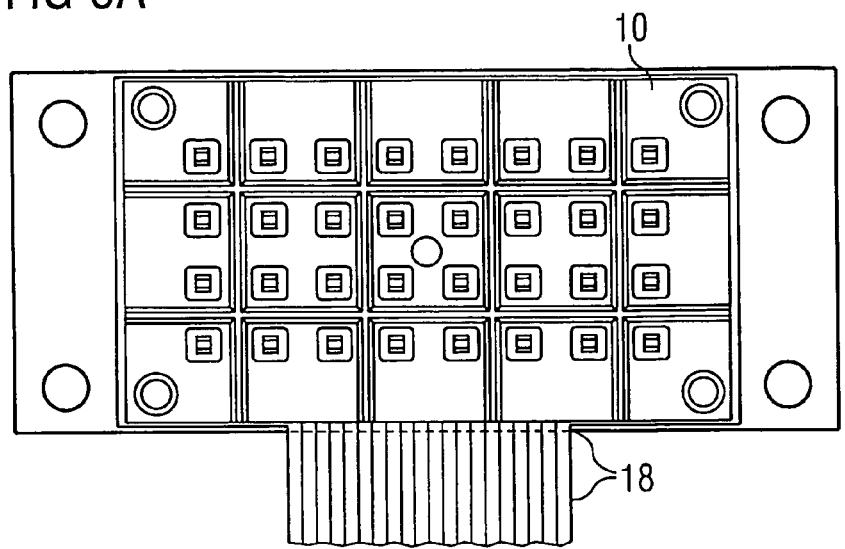
FIG 6B
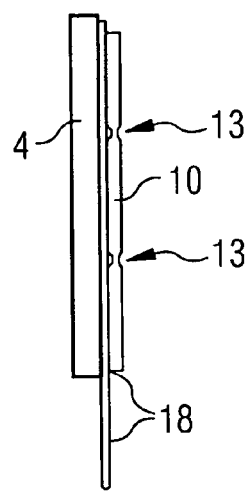
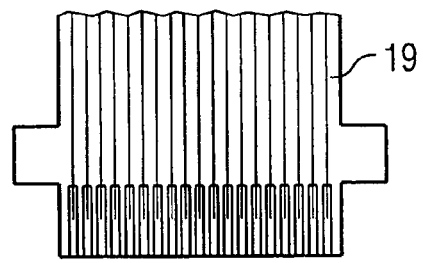
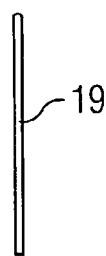

LIGHT SOURCE MODULE AND METHOD FOR PRODUCTION THEREOF

RELATED APPLICATIONS

This is a U.S. national stage of application Ser. No. PCT/DE03/003189, filed on 24 Sept. 2003.

This patent application claims the priority of German patent application no. 10245945.2filed 30 Sept. 2002, the disclosure content of which is hereby incorporated by reference.

FIELD OF THE INVENTION

The invention relates to a light source module having a plurality of LEDs (LED=light emitting device) connected to a metal carrier in an insulating manner.

BACKGROUND OF THE INVENTION

A light source module of this type is described e.g. in the published U.S. patent application No. 2003/01788627.

Published U.S. patent application No. 2004/0089898 discloses e.g. arranging an LED in a frame and potting the region between frame and LED with potting composition. In order to obtain a reflector, preferably reflective potting composition is first filled into the region between frame and LED and subsequently complete potting is effected using clear potting composition.

This manner of producing a light source module functions without any problems if only one LED is arranged within the frame.

However, if a plurality of LEDs are arranged in a frame, the frame is completely areally connected by the potting composition to the metal carrier on which the LEDs are arranged by means of an insulating layer.

In the event of greatly different temperature loads, the metal carrier expands differently with respect to the frame since the frame is generally not composed of metal and, consequently, the two materials have different coefficients of expansion.

The different coefficients of expansion of these two components mean that the LEDs are subjected to loading, which can consequently lead to failures of individual LEDs or in this way to the destruction of the entire light source module.

SUMMARY OF THE INVENTION

One object of the invention is to provide a light source module which withstands even greatly varying temperature conditions.

This and other objects are attained in accordance with one aspect of the invention by virtue of the fact that the LEDs are surrounded by a frame, a potting composition is arranged between the frame and the LEDs, and the frame has expansion joints.

By introducing the expansion joints into the frame, it is possible to use the technology disclosed in the above-mentioned published U.S. patent application no. 2004/0089898, namely the technology of placing a frame onto the LEDs and potting the interspace with potting composition.

The expansion joints may be realized either by means of portions which are kept extremely thin in the frame and can deform in the event of expansion, or else by means of slots extending completely through the frame.

The frame can be segmented into a plurality of frame parts by expansion joints.

In this case, a frame part can have a maximum of four cutouts in which LEDs can be arranged. In the case where the frame is produced from plastic and the metal carrier is produced from aluminum, this number of cutouts per frame part guarantees a high reliability and functionality even in the event of high temperature fluctuations.

The LEDs can be arranged in the light source module in a grid, e.g. in a grid of 4.5 mm in eight columns and four rows, and may be used for realizing an LED light source for an HUD system (HUD=Head-up Display) in a motor vehicle.

The segmentation of the frame for producing the light source module is preferably effected at the end of the process chain, i.e. after introduction in the potting composition. This may be done e.g. by means of a sawing device.

BRIEF DESCRIPTION OF THE DRAWINGS

FIG. 2 shows a frame for the light source module in the view from above, FIG. 3 shows the section A-A from FIG. 2, FIGS. 4A and 4B show the frame for the light source module in the view from above and in side view, FIGS. 5A and 5B show a carrier with applied printed circuit board for the light source module in the view from above and also in side view, and FIGS. 6A and 6B show the frame from FIGS. 4a and 4b and also the carrier with applied printed circuit board from FIGS. 5a and 5b in the mounted state.

DETAILED DESCRIPTION OF THE DRAWINGS

Figure 1:
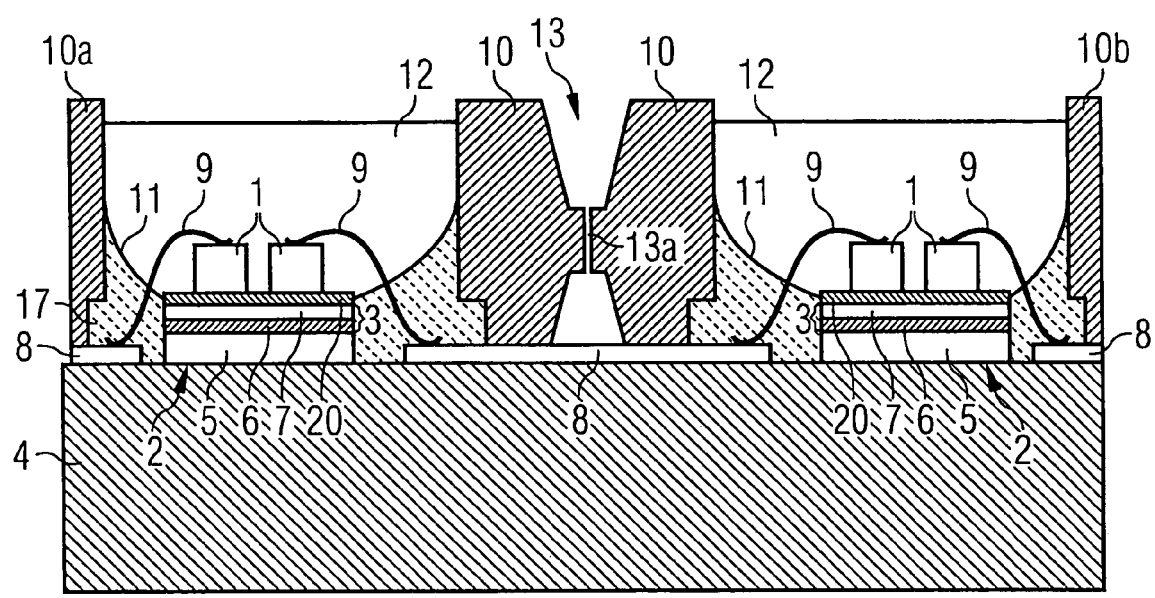
FIG. 1 shows a part of the light source module according to the invention in sectional view.

FIG. 1 shows an LED light source module in partial sectional view.

In the detail illustrated, the light source module has two LEDs, one LED in each case comprising two optoelectronic components 1 arranged on a carrier substrate 2.

The carrier substrate 2 is composed of a material exhibiting good thermal conductivity and it includes an interposed insulating layer 3 and also a carrier layer 5 on a metal carrier 4, which serves not only as a carrier but also as a heat sink. The metal carrier 4 is preferably composed of aluminum or copper in order to obtain a high dissipation of heat.

The insulating layer 3 integrated in the carrier substrate 2 generally comprises a silicon oxide layer 6 and a silicon nitride layer 7 applied on the silicon oxide layer 6. The silicon oxide layer is applied on a carrier layer 5 comprising silicon substrate. The insulating effect is obtained in particular by means of the silicon nitride and silicon oxide layers 7 and 6, the silicon substrate 5 essentially serving only as a carrier material. Conductive metal pads 20 for making contact with the LED are situated on the insulating layer 7.

Since silicon layers can be applied in extremely thin fashion and have a good thermal conductivity, these layers 6 and 7 are ideal for the electrical insulation of and the dissipation of heat from the optoelectronic components 1 via the carrier substrates 2 to the metal carrier 4.

Arranged between the carrier substrates 2 are printed circuit boards 8 serving for electrically interconnecting the optoelectronic components 1. A wiring 9 is provided for the connection between the printed circuit boards 8 and the optoelectronic components 1.

In order to be able to pot the LEDs and also for the purpose of producing a reflector, a frame 10 is placed onto the light source module, which frame in each case encloses a carrier substrate 2 with emplaced optoelectronic components 1.

The frame 10 is adhesively bonded at the underside to the printed circuit boards 8, thereby enabling the interspaces in which the LEDs are situated to be potted.

In order to obtain a reflector, the frame is first potted with reflective potting composition 11, such as e.g. white silicone or a filling composition with titanium oxide (TiO$_2$) or else an epoxy resin admixed with titanium oxide particles.

The potting is effected to just under the upper edge of the carrier substrate 2, the surface of the reflective potting composition 11 running concavely to the inner edge of the frame 10.

In the second step, the interior space is potted with clear potting composition 12, transparent silicone or transparent epoxy resin generally being used for this purpose.

As a result of the frame 10 being potted with the reflective and clear potting composition 11 and 12, said frame is connected more or less fixedly to the LEDs.

The frame 10 is generally produced from plastic for cost reasons, thus resulting in large loads with regard to the LEDs in the event of great temperature differences, since the plastic frame 10 expands differently than the metal carrier 4 that is generally composed of aluminum.

In order to absorb these mechanical loads on the LEDs, expansion joints 13 are provided in the frame 10 and can be used to absorb the greatly temperature-dependent expansion of the metal carrier 4 made of aluminum. The expansion joints 13 may be formed as a greatly tapered location in the frame 10, so that, at this greatly tapered location, the plastic of the frame 10 can deform elastically under the occurrence of loading.

The expansion joints 13, as illustrated in FIG. 1, may likewise also be formed as a complete separation of the frame 10 at this location. In the case of the complete separation of the frame 10, a separating cut 13a is generally provided in the expansion joint 13, thereby producing separate frame parts 10a and 10b.

FIG. 2 shows in a view from above the complete frame 10 such as is used e.g. for a light source module for a head-up display system (HUD system) in a motor vehicle.

The frame 10 has thirty-two cutouts 14 in each of which a carrier substrate 2 with at least two optoelectronic components 1, as illustrated in FIG. 1, are arranged.

For the head-up display system, for this purpose the light spots are arranged in a grid of 4.5 mm in eight columns and four rows. Polychromatic light spots are obtained by arranging a plurality of optoelectronic components 1 with different colors on a carrier substrate 2.

In order to avoid the possible damage to the LEDs due to great temperature fluctuations and the resulting different expansions of the frame 10 and of the metal carrier 4, the expansion joints 13 are arranged in latticed fashion in the frame 10, so that the frame is subdivided into a plurality of segments by the latticed expansion joints 13. A frame segment in this case comprises a maximum of four cutouts 14.

FIG. 3 shows the section A-A from FIG. 1 through the frame 10. The frame 10 is formed essentially in planar fashion and has pins 15 at its underside by means of which it can be mounted onto the metal carrier 4. Furthermore, mounting holes 16 are likewise provided which can likewise be used for fitting with the metal carrier.

The cutouts 14 are illustrated in cross section in the right-hand part of the section illustrated in FIG. 3, said cutouts having small undercuts 17 at the underside, so that the reflective potting composition 11 is also taken up in a positively locking manner.

At the locations of the expansion joints 13, the frame has a trapezoidal cutout on both sides, which results in forming a thin portion ("web") of the frame. This thin portion can be easily bent or deformed and can, thereby, compensate for deformations. As in FIG. 1, the remaining web is severed by means of a separating cut 13a at this location using a sawing device.

The severing may be effected after the mounting of the frame onto the metal carrier 4 has been concluded and also after the potting of the cutouts 14.

The mounting of the frame 10 is schematically illustrated briefly in FIGS. 4 to 6. FIGS. 4A to 6A in each case show the view from above, and FIGS. 4B to 6B show the side view.

FIGS. 4A and 4B show the frames described in FIGS. 2 and 3, and FIGS. 5A and 5B show the metal carrier 4 with a flexible printed circuit board 18 arranged thereon with a flexible conductor connection 19. The carrier substrates 2 and also the optoelectronic components 1 are applied on the flexible printed circuit board 18.

FIGS. 6A and 6B show how the frame 10 is merely plugged onto the metal carrier 4 with the flexible printed circuit board 18 already applied and is adhesively bonded to the latter.

The severing of the expansion joints 13 by means of the sawing device may be effected just after this method step or else not until after the potting of the cutouts 14.

The circuit board 18 differs from circuit board 8 of FIG. 1 in that circuit board 18 is a flexible circuit board. Furthermore, in the embodiment shown in FIG. 5A carrier substrate 2 and components 1 are arranged on the flexible circuit board 18 whereas in FIG. 1 carrier substrate 2 is directly applied on metal carrier 4.

The scope of protection of the invention is not restricted by the description of the invention on the basis of the exemplary embodiments. Rather, the invention encompasses any new feature and also any combination of features, which in particular comprises any combination of features in the patent claims, even if this combination is not specified explicitly in the patent claims.

The invention claimed is:

1. A light source module, comprising:
a metal carrier,
a plurality of LEDs connected to the metal carrier in an insulating manner,
a frame surrounding the plurality of LEDs, the frame comprising expansion joints, the expansion joints each comprising a separation cut,
potting composition arranged between the frame and the plurality of LEDs, and
a printed circuit board disposed between the frame and the metal carrier for electrically connecting the plurality of LEDs, the printed circuit board being arranged to cover portions of the metal carrier;
wherein the plurality of LEDs are connected to the metal carrier on regions of the metal carrier that are not covered by the printed circuit board.

2. The light source module as claimed in claim 1, wherein the frame is segmented into a plurality of frame parts by the expansion joints.

3. The light source module as claimed in claim 2, wherein a maximum of four cutouts for receiving LEDs are provided per each of the frame parts.

4. A method for producing a light source module as claimed in claim 2, wherein the segmentation of the frame is carried out by means of a sawing device, so that separating cuts arise between the frame parts.

5. The light source module as claimed in claim 1, wherein the frame is produced from plastic.

6. The light source module as claimed in claim 1, wherein the frame is adhesively bonded at the underside toward the printed circuit board.

7. The light source module as claimed in claim 1, wherein the metal carrier is produced from aluminum or copper.

8. The light source module as claimed in claim 1, wherein the LEDs are arranged in a grid.

9. The light source module as claimed in claim 1, wherein the printed circuit board is a flexible printed circuit board.

10. The light source module as claimed in claim 1, wherein two LEDs are separated from each other by said frame, and the two LEDs are electrically interconnected by said printed circuit board.

11. The light source module as claimed in claim 10, wherein each LED comprises several optoelectronic components arranged on a carrier substrate.

12. The light source module as claimed in claim 11, wherein said printed circuit board is arranged between said carrier substrates.

* * * * *